(12) United States Patent
Degrenne

(10) Patent No.: US 11,217,378 B2
(45) Date of Patent: Jan. 4, 2022

(54) INDUCTIVE ASSEMBLY AND METHOD OF MANUFACTURING INDUCTIVE ASSEMBLY

(71) Applicant: MITSUBISHI ELECTRIC CORPORATION, Tokyo (JP)

(72) Inventor: Nicolas Degrenne, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 320 days.

(21) Appl. No.: 16/467,235

(22) PCT Filed: Nov. 30, 2017

(86) PCT No.: PCT/JP2017/043891
§ 371 (c)(1),
(2) Date: Jun. 6, 2019

(87) PCT Pub. No.: WO2018/150694
PCT Pub. Date: Aug. 23, 2018

(65) Prior Publication Data
US 2020/0075216 A1    Mar. 5, 2020

(30) Foreign Application Priority Data
Feb. 16, 2017  (EP) .................................... 17305175

(51) Int. Cl.
*H01F 5/04* (2006.01)
*H01F 5/06* (2006.01)
(Continued)

(52) U.S. Cl.
CPC .............. *H01F 27/027* (2013.01); *H01F 3/08* (2013.01); *H01F 5/003* (2013.01); *H01F 5/04* (2013.01);
(Continued)

(58) Field of Classification Search
CPC .......... H01F 27/027; H01F 5/04; H01F 5/003; H01F 3/08; H01F 17/0006; H01F 27/306;
(Continued)

(56) References Cited

U.S. PATENT DOCUMENTS 7,271,697 B2 *  9/2007  Whittaker ........... H01F 17/0033
                                                          336/229
7,489,226 B1 *  2/2009  Chignola ............ H01F 27/2804
                                                          336/229
(Continued)

FOREIGN PATENT DOCUMENTS

EP          0893699 A1    1/1999
JP          7-78717 A     3/1995
(Continued)

*Primary Examiner* — Tuyen T Nguyen
(74) *Attorney, Agent, or Firm* — Birch, Stewart, Kolasch & Birch, LLP

(57) ABSTRACT

An inductive assembly includes: a support with an open channel having a straight portion with a bottom surface and two side surfaces, a foldable PCB such that to cover at least a part of the bottom surface and the side surfaces, the PCB having a plurality of tracks, each track being electrically continuous between a pair of connecting spots, a magnetic piece which can be accommodated into the channel equipped with the PCB. The PCB is arranged to surround at least partially a portion of the magnetic piece in the folded state in the channel such that at least one connecting spot of a first track is electrically connected to a connecting spot of a second track to form a winding around the magnetic piece and to inductively couple the PCB and the magnetic piece.

12 Claims, 8 Drawing Sheets

(51) Int. Cl.
*H01F 27/02* (2006.01)
*H01F 3/08* (2006.01)
*H01F 17/00* (2006.01)
*H01F 27/30* (2006.01)
*H05K 1/18* (2006.01)
*H01F 5/00* (2006.01)
H01F 27/06 (2006.01)

(52) U.S. Cl.
CPC ....... *H01F 17/0006* (2013.01); *H01F 27/306* (2013.01); *H05K 1/182* (2013.01); *H01F 5/06* (2013.01); H01F 2027/065 (2013.01)

(58) Field of Classification Search
CPC ...... H01F 17/06; H01F 5/06; H01F 2027/065; H05K 1/182
See application file for complete search history.

(56) References Cited

U.S. PATENT DOCUMENTS

| | | | |
|---|---|---|---|
| 9,754,714 B2 * | 9/2017 | Quilici | ................. H01F 27/306 |
| 2001/0043135 A1 | 11/2001 | Yamada et al. | |

FOREIGN PATENT DOCUMENTS

| | | |
|---|---|---|
| JP | 8-203762 A | 8/1996 |
| JP | 11-94922 A | 4/1999 |
| JP | 2002-43138 A | 2/2002 |

* cited by examiner

INDUCTIVE ASSEMBLY AND METHOD OF MANUFACTURING INDUCTIVE ASSEMBLY

TECHNICAL FIELD

The invention pertains to the technical field of the energy. More specifically, the invention is related to an inductive assembly to convert energy between electric and magnetic forms. The invention is also related to a process to manufacture such an assembly.

BACKGROUND ART

Usually, inductors or transformers for power electronics applications, for example to support at least 1 kilowatt, are made of discrete components. Such components can be surface-mounted, through-hole, or connected manually with cables. These components have a low level of integration and are expensive, difficult to cool, and require manual intervention.

SUMMARY OF INVENTION

Technical Problem

A large part of integrated inductors or transformers include a planar architecture. The components with a planar architecture generally have the following limitations:
 a poor copper filling, due to few turn numbers and/or a small copper section,
 high copper losses, due to direct current (DC), high-frequency effects and combination of skin effect, proximity of the components and air gap, and
 a poor copper cooling.

In addition, the integrated inductors and transformers are difficult to cool.

Other structures include embedded toroid architectures for which one dimension of the magnetic material needs to be inferior to the thickness of a printed circuit board (PCB; i.e. typically less than 2 or 3 millimeters). Such architectures are therefore only limited to applications in the Watt level or less.

Solution to Problem

The invention improves the situation.

The applicant proposes an inductive assembly comprising:
 a support including a main face wherein an open channel is formed, the channel having at least one straight portion with a bottom surface of the channel connecting at least two side surfaces of the channel to each other,
 a printed circuit board, the printed circuit board being foldable from a plate shape to a folded state such that to cover at least a part of the bottom surface and at least a part of the side surfaces of the straight portion of the channel, the printed circuit board comprising a plurality of tracks, each track being electrically continuous between a pair of connecting spots,
 a magnetic piece having a shape and a size corresponding to the shape and the size of the channel such that the magnetic piece can be accommodated into the channel when the printed circuit board equips the channel. The printed circuit board is arranged to surround at least partially a portion of the magnetic piece in the folded state in the channel such that at least one connecting spot of a first track is electrically connected to a connecting spot of a second track to form a winding around the magnetic piece and to inductively couple the printed circuit board and the magnetic piece.

Such an assembly is adapted to at least kilowatt levels (current of several amperes) with high efficiency (few losses), low magnetic section, low mass, small and adapted size and form, and easy to cool.

The inductive assembly can comprise the following features, separately or in combination one with the others:
 The printed circuit board comprises main portions arranged to surround said portion of the magnetic piece in the folded state. In such an embodiment, a single PCB is sufficient. A second PCB is not needed.
 The printed circuit board is a first printed circuit board and comprises main portions arranged to only partially surround said portion of the magnetic piece in the folded state,
 the connecting spots of each pair being distant one from the other in a state where the printed circuit board equips the channel, the inductive assembly further comprising:
 a second printed circuit board having a plate form and comprising a plurality of a tracks, each track being electrically continuous between a pair of connecting spots, the shape and the size of the second printed circuit board and the locations of the connecting spots being mutually arranged such that the second printed circuit board can be assembled to the first printed circuit board to surround together the magnetic piece when the magnetic piece is disposed into the channel, and such that the two connecting spots of each pair of the second printed circuit board is electrically connected respectively to a connecting spot of a first track of the first printed circuit board and to a connecting spot of a second track of the first printed circuit board, thereby the electrical connection of the spots of the first printed circuit board being ensured through the tracks of the second printed circuit board to form windings around the magnetic piece and to inductively couple the printed circuit boards and the magnetic piece. In such an embodiment, the second PCB can be used to connect other elements to the inductive assembly.

The connecting spots comprise solder pads able to be soldered two by two. This enables to quickly and easily connect the connecting spots one to the others.

The channel covered by the printed circuit board includes at least a straight portion having a length superior to 1 centimeter. This enables to obtain an inductive assembly with a great efficiency.

The tracks comprise a wire embedded inside the printed circuit board. This enables to have large section of conductive elements to support high power while having small size of the inductive device.

A connection between at least some of the connecting spots and corresponding tracks of the printed circuit board is performed with a Vertical Interconnect Access such that the printed circuit board is able to electronically receive components once being disposed over the magnetic piece. Such an inductive assembly can be used as a support for other electronic components.

The inductive assembly further comprises at least one power semiconductor element, positioned on the printed circuit board or embedded into the printed circuit board, at least partially above one of the side surfaces. Such an arrangement enhances the heat dissipation through the side surfaces.

The support comprises a core part, an internal wall and an external wall, the internal wall and the external wall protruding away from the core part, the open channel being delimited between the internal wall and the external wall. As a consequence, spaces are formed next to the channel and other electronic components can be disposed in thickness of the inductive assembly.

The inductive assembly further comprises at least one capacitor, fixed on a face of the printed circuit board oriented toward the support and in an external side of the external wall and/or internal side of the internal wall. Capacitors can be provided without any increasing of the total thickness of the inductive assembly.

In a second aspect of the invention, the applicant proposes a kit of pieces to assemble comprising at least two pieces mutually compatibles to form an assembly according to one of the preceding claims, among the following pieces:
the support,
the first printed circuit board,
the magnetic piece, and
the second printed circuit board.

In a third aspect of the invention, the applicant proposes a method of manufacturing an inductive assembly comprising:

a) provide a support including a main face wherein an open channel is formed, the channel having at least one straight portion with a bottom surface of the channel connecting two side surfaces of the channel to each other, b) dispose on the support a printed circuit board having a plate shape and comprising a plurality of a tracks, each track being electrically continuous between a pair of connecting spots, c) press the support and the printed circuit board toward each other such that the printed circuit board is folded and such that the printed circuit board covers the bottom surface and the side surfaces of at least the straight portion of the channel of the support, d) provide a magnetic piece having a shape and a size corresponding to the shape and the size of the channel into the channel once the printed circuit board equipping the channel, and implement the following steps e1 and f1, or the following steps e2 and f2:

e1) assemble to the printed circuit board and above the magnetic piece a second printed circuit board having a plate shape and comprising a plurality of tracks, each track being electrically continuous between a pair of connecting spots, f1) connect electrically the two connecting spots of each pair of the second printed circuit board respectively to a connecting spot of a first track of the first printed circuit board and to a connecting spot of a second track of the first printed circuit board to form a winding around the magnetic piece and to inductively couple the printed circuit boards and the magnetic piece, e2) fold up a portion of the printed circuit board above the magnetic piece, f2) connect electrically at least one connecting spot of a first track to a connecting spot of a second track to form a winding around the magnetic piece and to inductively couple the printed circuit board and the magnetic piece.

Other features, details and advantages will be shown in the following detailed description and on the figures.

DESCRIPTION OF EMBODIMENTS

Figure 1:
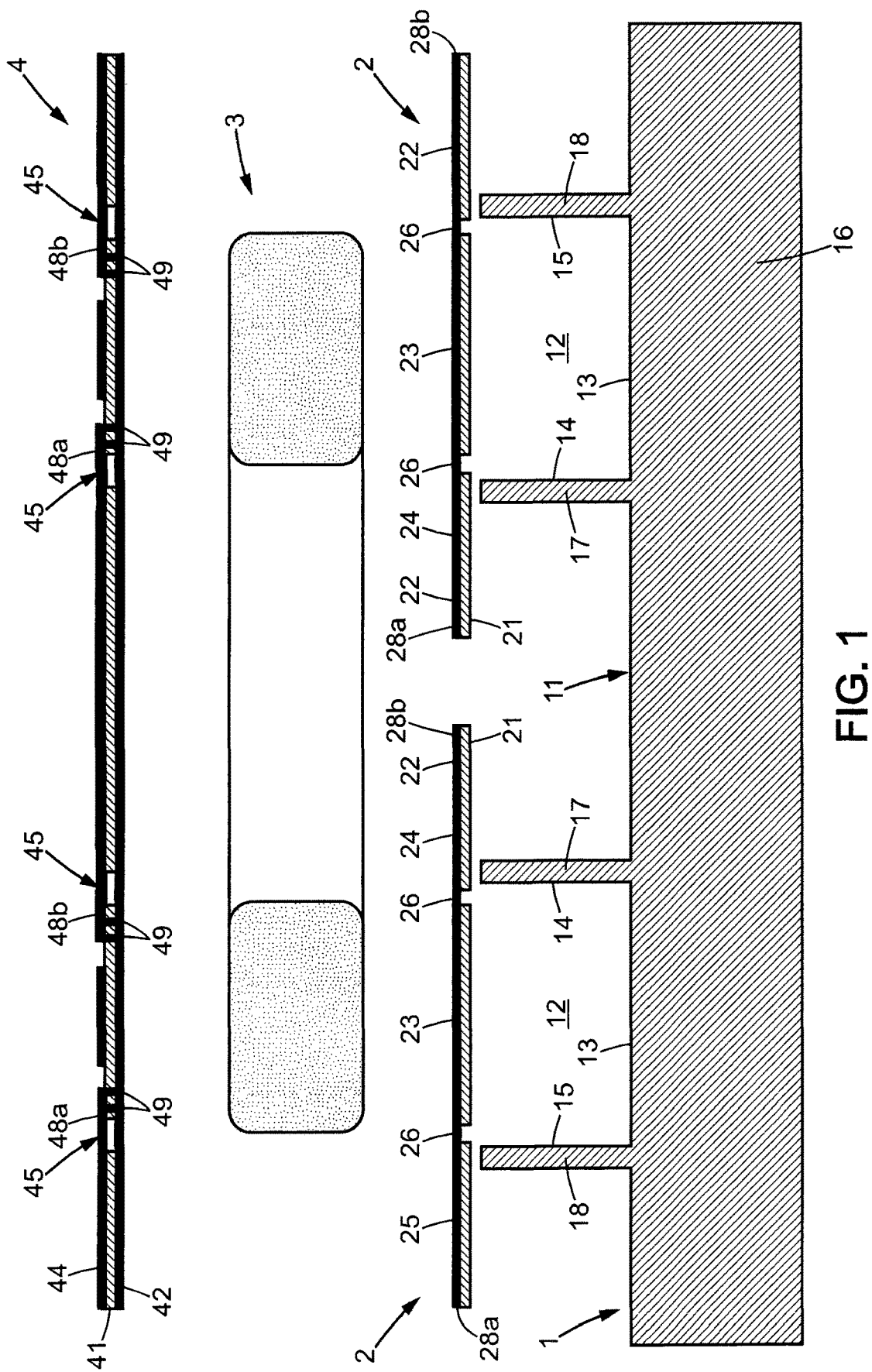
FIG. 1 is a sectional view of pieces composing an assembly according to the invention before assembling process.

Figures and the following detailed description contain, essentially, some exact elements. They can be used to enhance understanding the invention and, also, to define the invention if necessary. It should be understood that some details of the three dimension structure of the device are difficult to describe exhaustively other than by figures.

In the following, the word "annular" is used to geometrically define a form (3D) or a shape (2D) with a through opening (or a closed-loop, a closed circle), whatever the outline forms. In other words, the word "annular" has not to be strictly interpreted as a circular/cylindrical meaning.

FIGS. 1 to 5 corresponds to a first embodiment of an inductive assembly 100. The inductive assembly 100 comprises:
a support 1;
a first printed circuit board (PCB) 2;
a magnetic piece 3; and
a second PCB 4.

The support 1 includes a main face 11 wherein at least one open channel 12 is formed. The channel 12 has at least one straight portion. The channel 12 can have an annular form, which means a closed-circuit form, for example an elongated form or an oblong form. The channel 12, and especially the straight portion, has a bottom surface 13, an internal side surface 14 and an external side surface 15. The bottom surface 13 connects the internal side surface 14 and the external side surface 15 to each other.

In the examples, the channel 12 includes two straight portions, substantially parallels. The section of the channel 12 is substantially constant and rectangular. Each one of the bottom surface 13, the internal side surface 14 and the external side surface 15 are planar. The bottom surface 13 is parallel to the main face 11. The bottom surface 13 is perpendicular to the internal side surface 14 and to the external side surface 15. Such a form is particularly adapted to receive a folded PCB as it will be explain after.

In various embodiments, the channel 12 can have different forms. For example, the channel 12 can have a generally toroidal form with at least a straight portion and rounded sections. The section can also be at least partially rounded and/or contain fillets. The channel 12 can have a single straight portion. Preferably, the straight portion has a length superior to 1 centimeter.

In various embodiments, the channel 12 can be discontinuous. For example, the two straight portions shown on FIGS. 1 to 4 can be unconnected (not linked by their ends via rounded portions of the channel 12). In such a case, the two straight portions can also be viewed as two distinct channels. In any case, a channel 12 is able to receive the magnetic piece 3 at least partially.

In the embodiment of FIGS. 1 to 5, the support 1 comprises a core part 16, an internal wall 17 and an external wall 18. The internal wall 17 and the external wall 18 protrude away from the core part 16. The channel 12 is delimited between the internal wall 17 and the external wall 18. The channel 12 is over the core part 16. The free spaces besides the channel 12 enable to dispose other components close to the channel 12. The internal wall 17 and the external wall 18 can be viewed as fins of the support 1.

Figure 6:
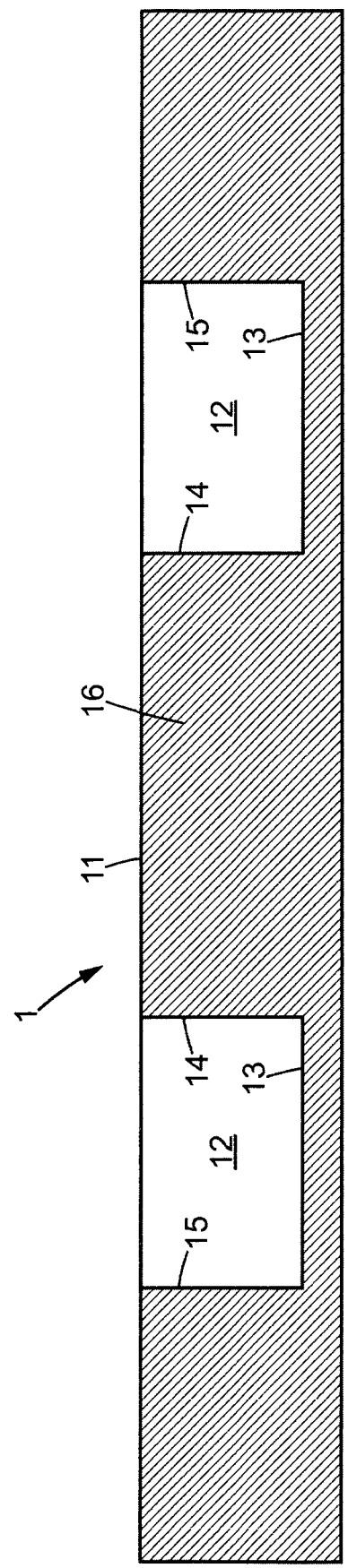
FIG. 6 is a sectional view of a support according to the invention.

FIG. 6 shows a various embodiment of the support 1. The identical numerical references used in two figures refer to similar objects, including for two distinct embodiments. The support 1 comprises a core part 16. There is no wall protruding from the core part 16. The channel 12 is embedded inside the core part 16. Such a channel 12 can be obtained by any relevant machining of a core part 16, for example by material shrinking, such as a milling. The support 1 can be thin while having a good mechanical strength.

Figure 2:
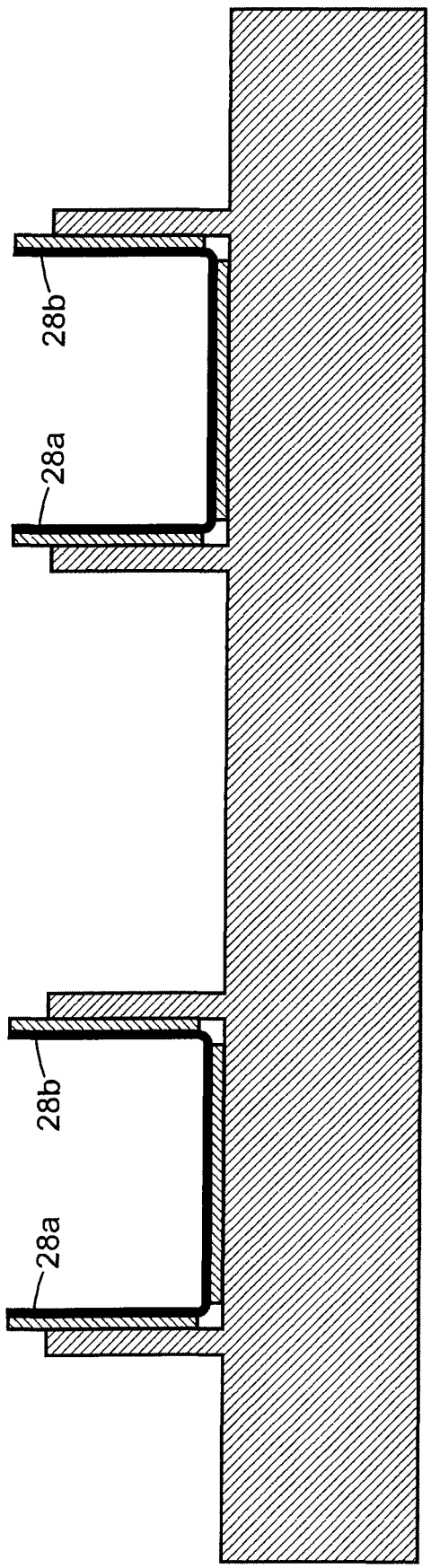
FIG. 2 is a sectional view during an intermediate step of the assembling process of pieces of FIG. 1.
Figure 3:
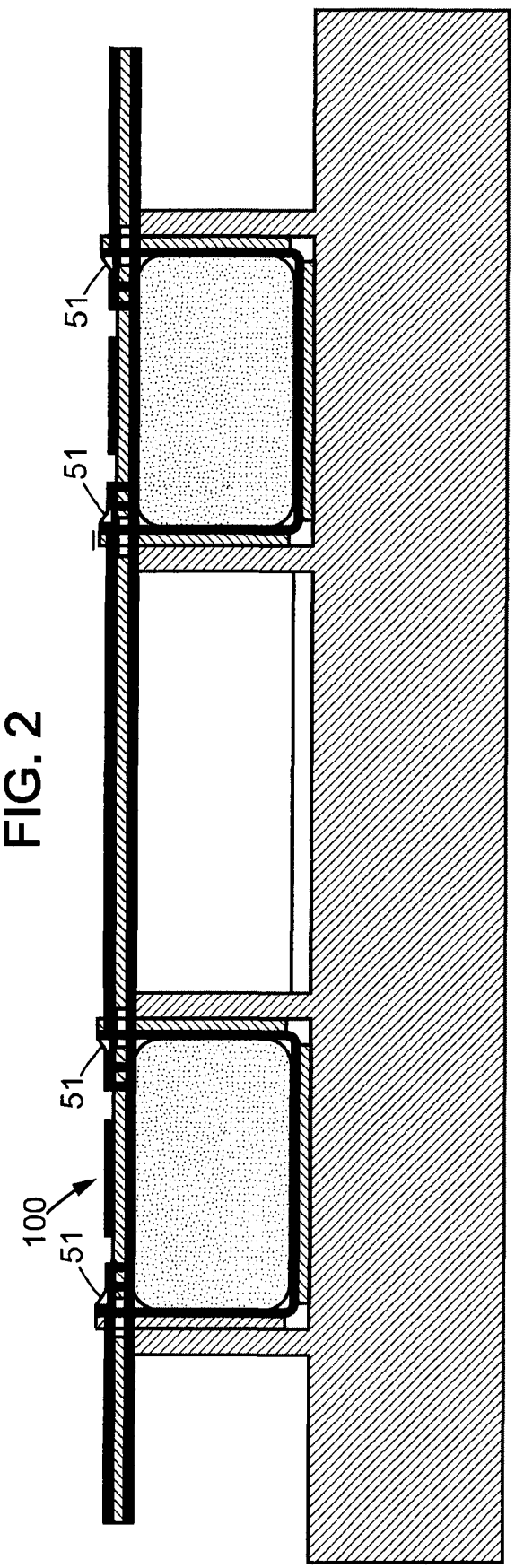
FIG. 3 is a sectional view of an assembly of the pieces of FIG. 1.
Figure 4:
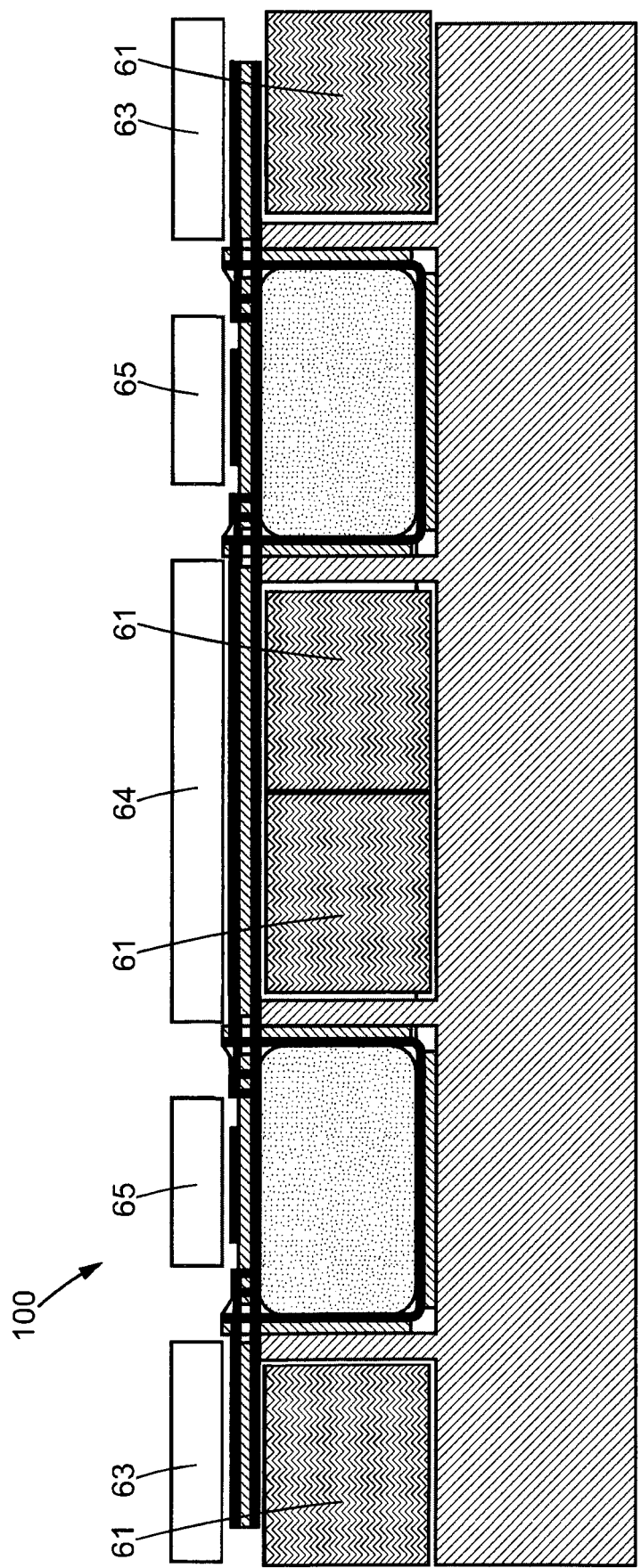
FIG. 4 is a sectional view of an assembly according to the invention.

A first PCB 2 is foldable from a planar state, shown for example on FIG. 1, to a folded state, shown for example on FIGS. 2, 3 and 4. The planar state of the first PCB 2 corresponds to an inactive state, for example during manufacturing of the first PCB 2 and before assembling it with other elements of the assembly 100. In the planar state, the first PCB 2 has a general plate shape. The first PCB 2 is arranged to equip the channel 12 in an operational state, corresponding to the folded state. In the folded state, the first PCB 2 covers at least partially the bottom surface 13, the internal side surface 14 and the external side surface 15 of at least the straight portion of the channel 12.

In the embodiment of FIGS. 1 to 5, the assembly 100 comprises two similar first PCB 2, each one being adapted to be placed into a respective straight portion of the channel 12.

The first PCB 2 includes at least a support layer 21 and at least one electrical conductive layer 22. In various embodiments, the first PCB can comprise multilayers, including a plurality of electrical conductive layers.

The first PCB 2 comprises a plurality of main portions:
a bottom portion 23 planned to cover the bottom surface 13 of the channel 12,
an internal side portion 24 planned to cover the internal side surface 14 of the channel 12, and
an external side portion 25 planned to cover the external side surface 15 of the channel 12.

The length of each main portions 23, 24, 25 (in the direction perpendicular to the plan direction of the FIGS. 1 to 4) is selected in correspondence to the length of the respective surface to cover. If there is no obstruction on the support 1 beyond the straight portion of the channel 12, the length of the bottom portion 23 can be superior to the length of the straight portion.

The width of each main portions 23, 24, 25 is selected in correspondence to the width of the respective surface to cover. The width of the bottom portion 23 is inferior to the width of the bottom surface 13 to enable the insertion (see FIG. 2). In the embodiment of FIGS. 1 to 5, the width of the side portions 24, 25 is superior to the depth of the channel 12 (the height of the side surfaces 14, 15). In the operational state, the side portions 24, 25 protrude away from the channel 12 (see FIG. 2). This facilitates the electrical connection as described hereinafter. In various embodiments, the side portions 24, 25 do not protrude from the channel 12.

The bottom portion 23 is delimited from the internal side portion 24, respectively from the external side portion 25, by respective folding lines 26 of the first PCB 2. In the embodiment of FIGS. 1 to 5, each folding line 26 results from a discontinuity of the support layer 21. In other words, the support layer 21 is composed of distinct parts. Each folding line 26 is physically obtained by forming a gap between the support layer 21 of each main portion 23, 24, 25. The adjacent main portions 23, 24, 25 are mechanically connected one to the other only by the electrical conductive layer 22. In such embodiments, the support layer 21 is made of a plurality of distant pieces. In various embodiments, the folding lines 26 can be obtained by forming grooves into the support layer 21. The folding lines 26 correspond to parts of the support layer 21 with a thickness thinner than the rest of the support layer 21. Such grooves can be obtained by machining (for example by shrinking material). In such embodiments, the support layer 21 is made in an integral piece, at least in the planar state of the first PCB 2.

The first PCB 2, and especially the electrical conductive layer 22, comprises a set of tracks 27. Each track 27 is electrically isolated from the other. Each track 27 is electrically continuous between a pair of connecting spots 28a, 28b. In a state where the first PCB 2 equips the channel 12, the connecting spots 28a, 28b of each pair are located both away from the bottom surface 13 and respectively on the internal side surface 14 and on the external side surface 15 of the channel 12. In the planar state, each track 27 extends substantially in the width direction of the first PCB 2. The opposite ends of each track 27 forms the connecting spots 28a, 28b. The connecting spots 28a, 28b are located proximate to an edge opposite to the bottom portion 23 respectively on the internal side portion 24 and on the external side portion 25.

Each track 27 is arranged to form a partial winding, partially surrounding a part of the magnetic piece 3 in the operational state, in a manner to be inductively coupled to the magnetic piece 3. The tracks 27 of a set can be substantially parallel to each other. The tracks 27 of a set can be oriented in the width direction or to be slightly angled with respect to the width direction, for example ±20°.

In the embodiment of FIGS. 1 to 5, the connecting spots 28a, 28b protrude over the channel 12 in the operational state.

According to the embodiment of the FIGS. 1 to 4, the tracks 27 cross the folding lines 26, between the bottom portion 23 and the internal side portion 24, and between the bottom portion 23 and the external side portion 25. The portions of the tracks 27 crossing the folding lines 26 can be the singles mechanical links between the portions 23, 24, 25. In various embodiments, supplementary mechanical links can be added in order to strength the first PCB 2 while being foldable. The tracks 27 are arranged to support at least one folding movement from the planar state to an operational state of the first PCB 2. The portion of the tracks 27 crossing the folding lines 26 can comprise, for example, a flexible wire or a flexible ribbon cable. Additional elements can be added in order to enhance the mechanical strength of the first PCB 2. Such elements can have a similar structure as the tracks 27 even if such tracks have no electrical function.

In the embodiment of FIGS. 1 to 4, the first PCB 2 is arranged to be folded such that the electrical conductive layer 22 is on the inner face of the folding angle, which means on the internal side of the channel 12. The risk of deterioration during folding operations of the conductive layer 22, and especially the tracks 27, is reduced. Thereby, the electrical continuity from one portion to another portion through the folding lines 26 is preserved during and after folding operations. In addition, the length of the conductive material needed to cross the folding lines 26, here copper, is lower than if the conductive material is planned to be on the external side of the folding angle. In embodiments including a plurality of conductive layers, the electrical continuity between two adjacent portions is also preferably ensured by the conductive layer the closest to the inner face of the folding angle.

In various embodiments, at least one of the conductive layers can be arranged on the outer face of the folding angle, including a conductive layer having tracks 27 and ensuring electrical continuity between the main portions of the first PCB 2.

When an assembly 100 is formed, the first PCB 2 is folded from its planar state to its folded state and disposed inside the channel 12 of the support 1. This can be made in a single step by pressing the support 1 and the first PCB 2 toward each other. The result of such a step is shown for example on FIG. 2. In the folded state, the first PCB 2 has a U-shape section. Then, the magnetic piece 3 is inserted.

The magnetic piece 3 includes at least one straight portion 31. The form and size of the magnetic piece 3 is selected to fit with the channel(s) 12.

Figure 5:
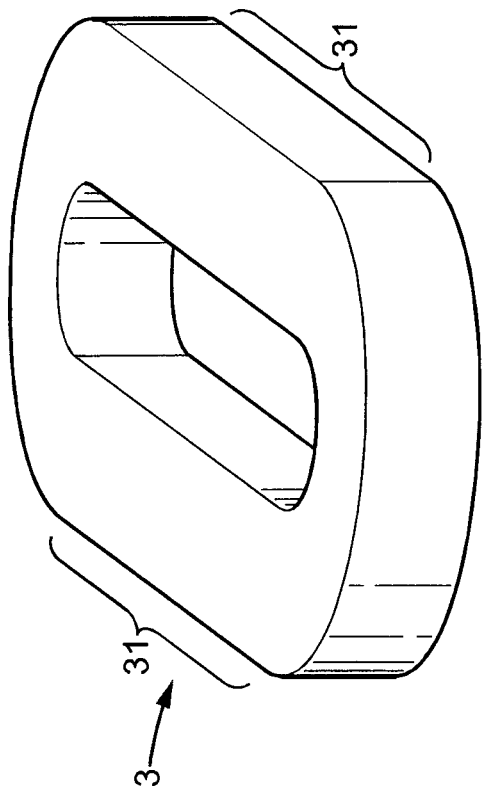
FIG. 5 is a perspective view of a magnetic piece according to the invention.

The magnetic piece 3 shown on FIG. 1 is also shown in an isolated perspective view on FIG. 5. In the example of FIG. 5, the magnetic piece 3 includes two straight portions 31. The magnetic piece 3 has an annular form, which means a closed-circuit form, more specifically an elongated form or an oblong form. The two straight portions 31 are substantially parallels. The section of the magnetic piece 3 is substantially constant and rectangular. Each straight portion 31 has four planar surfaces. The magnetic piece is composed at least partly of a material having ferromagnetic properties, for example iron powder or ferrite.

In various embodiments, the magnetic piece 3 can have different forms and sizes fitting with the form and size of the channel(s) 12. For example, the magnetic piece 3 can have a generally toroidal form with at least one straight portion 31 and rounded sections. The section can also be at least partially rounded and/or contain fillets. The magnetic piece 3 can have a single straight portion 31. Preferably, the straight portion 31 has a length superior to 1 centimeter. The magnetic piece 3 can also have a non-annular form. For example, the magnetic piece 3 can have a form of a bar, which can be entirely straight. The assembly 100 can also comprise a plurality of distinct magnetic pieces 3 each corresponding to a distinct channel 12.

In the example of FIG. 5, the magnetic piece 3 is solid and made in a single piece. In various embodiments, the magnetic piece 3 can be composed of a plurality of solid pieces, for example two parallelepipeds and two semi-rings. The magnetic piece 3 can also be molded directly into the channel 12, for example by using a fluid magnetic material such as a powder or a combination of powder with resin and/or glue. Further parts of mold can be used. In function of the magnetic material, the molding can also comprise a curing, preferably at a temperature less than 200° C.

Once the first PCB 2 equips the channel 12 of the support 1, the magnetic piece 3 is accommodated into the channel 12.

In the examples of FIGS. 1 to 4 and 7 to 8, the magnetic piece 3 is then encapsulated in the channel 12 by the second PCB 4. In the examples of FIGS. 11 to 14, the magnetic piece 3 is then encapsulated in the channel 12 by a supplementary main portion, called cover portion 40, of the first PCB 2, in absence of any second PCB. In the following, the second PCB 4 will be described relative to FIGS. 1 to 4.

The second PCB 4 is not planned to be folded. The second PCB 4 has a plate form in the inactive state and in the operational state. The assembly 100 comprises a single second PCB 4 adapted to be placed over both straight portions of the channel 12.

The second PCB 4 includes at least a support layer 41 and at least one electrical conductive layer 42. In the embodiments of figures, the second PCB 4 comprises multilayers, including a plurality of electrical conductive layers: a bottom electrical conductive layer 42 and a top electrical conductive layer 44. In the embodiments with a plurality of electrical conductive layers, the second PCB 4 further comprises electrical connections between layers, for example vertical interconnect access 49 (VIA).

In the embodiment of the figures, the form and size of the second PCB 4 is selected in order to extend beyond the straight portions of the channel 12. This offers a large surface to connect other electronical components. In various embodiments, the form and size can be different. For example, the second PCB 4 can be adapted to cover only the straight portions of the channel 12. The assembly can comprise two or more distinct seconds PCB 4.

The second PCB 4, and especially the bottom electrical conductive layer 42, comprises a set of tracks 47. Each track 47 is electrically isolated from the other. Each track 47 is electrically continuous and connected between a pair of connecting spots 48a, 48b. The connecting spots 48a, 48b are arranged to be electrically connected to the connecting spots 28a, respectively 28b, of the first PCB 2 in the operational state. In the operational state, the two connecting spots 48a, 48b of each pair of the second PCB 4 is electrically connected respectively to a connecting spot 28a of a first track 27 of the first PCB 2 and to a connecting spot 28b of a second track 27 of the first PCB 2. As a result, the set of tracks 27 and 47 connected together forms a single continuous track, said single track forming windings, or loops, surrounding a straight portion 31 of the magnetic piece 3.

In the operational state of the embodiment of the FIGS. 1 to 4, each track 47 extends substantially in the width direction of the channel 12. The opposite ends of each track 47 are located proximate to the internal side portion 24, respectively proximate to the external side portion 25, of the channel 12. Each track 47 is arranged to form a partial winding, partially surrounding a part of the magnetic piece 3 in the operational state, in a manner to be inductively coupled to the magnetic piece 3. The tracks 47 of a set can be substantially parallel to each other. The tracks 47 of a set can be oriented in the width direction or to be slightly angled with respect to the width direction, for example ±20°.

In the embodiments of FIGS. 1 to 4, the second PCB 4 comprises through openings 45, here in form of slots. The openings 45 are arranged to enables to fit with the parts of the first PCB 2 protruding from the channel 12 (see FIG. 3). In a step of the assembling, the end parts of the first PCB 2 protruding from the channel 12 are inserted through the openings 45 of the second PCB 4 until the second PCB 4 is put on the free ends of the internal wall 17 and the external wall 18 of the support 1 and on the magnetic piece 3.

The fitting of the end parts of the first PCB 2 and the openings 45 into the second PCB 4 enables to adjust the relative positions of the first PCB 2 and the second PCB 4. Here, each one of the four openings shown on FIGS. 1 and 3 are made of a single continuous slot. The corresponding parts of the first PCB 2 are continuous. In various embodiments, each opening 45 is made of a discontinuous slot and the corresponding part of the first PCB 2 is made of corresponding tongues. The parts of the first PCB 2 protruding from the channel 12 can have a crenel shape.

As described above, the connecting spots 28a, 28b of the first PCB 2 are over the second PCB 4 in an operational state of the embodiment of FIGS. 1 to 4. The connecting spots 48a, 48b of the second PCB 4 are included into the top electrical conductive layer 44. The electrical connection between the connecting spots 28a, 28b and the connecting spots 48a, 48b can be enhanced by adding a welding spot 51 (see FIG. 3). In such embodiments, the adding of the welding spots can easily be made by known techniques after the second PCB 4 being placed.

In a various embodiment, the connecting spots 28a, 28b and/or 48a, 48b comprise solder pads able to be soldered two by two (see also FIGS. 11 to 14). In the configuration shown on figures, the connecting spots 28a, 28b extend substantially perpendicular to the connecting spots 48a, 48b.

In the embodiment of FIGS. 1 to 4, the second PCB 4 comprises VIA 49 ensuring electrical connections between the bottom electrical conductive layer 42, including the tracks 47, and the top electrical conductive layer 44, including the connecting spots 48a, 48b. At least some of the VIA 49 ensure electrical conductivity between the tracks 47 of the bottom electrical conductive layer 42 and the connecting spots 48a, 48b of the top electrical conductive layer 44.

In various embodiments, including when the side portions 24, 25 of the first PCB 2 do not protrude from the channel 12, the electrical connections between the tracks 27, 47 of the two PCB 2, 4 to form windings can be different. For example, the assembly 100 can also include wires and/or plug-socket devices.

The layout of the tracks 27, 47 is selected together in order to form windings around the straight portion 31 of the magnetic piece 3 when the assembly 100 is in an operational state. The single and continuous track formed of the set of tracks 27, 47 extends in a constant rotational direction around the magnetic piece 3. When the assembly 100 is in an operational state and when a current circulates in the single and continuous track, the induced magnetic fields of loops are superimposed without being cancelling themselves, such that the windings of each straight portion is electrically and magnetically efficient.

FIG. 3 shows the assembly 100 after the second PCB 4 was disposed. FIG. 4 shows the same assembly 100 where the elements referenced 61 corresponds to spaces planned to receive heat sinks. In such a configuration, the heat sinks are close to the inductive coupling, included inside the annular form of the magnetic piece 3. The external spaces 61 can also be used to fix at least one capacitor on a face of the second PCB 4 oriented toward the support 1.

The second PCB 4 is able to electronically receive components once being disposed over the magnetic piece 3. Volumes 63, 64 and 65 on FIG. 4 can be used to connect Surface Mounted Devices (SMD) to the top electrical conductive layer 44, for example power semiconductor element and gate drivers. The volumes 63 and 64 are partially above respectfully the external wall 18 and its external side surface 15, and the internal wall 17 and its internal side surface 14. In an embodiment, volumes 63 and 64 are used to dispose at least one power semiconductor element. The cooling of the elements disposed above the internal wall 17 and/or the external wall 18 is particularly efficient. In various embodiments, the internal wall 17 and/or the external wall 18, and consequently also the internal side surface 14 and/or the external side surface 15 can be not perpendicular to the main plan of the support 1. For example, the internal side surface 14 and/or the external side surface 15 can form an angle with the main face 11 of the support 1 comprised between 45° and 90°. The section of the channel 12 can be flared. For example, the channel 12 can have a width increasing from the bottom of the channel 12 towards the mouth of the channel 12 or vice versa. Such a channel 12 can be obtained by extrusion process.

Figure 9:
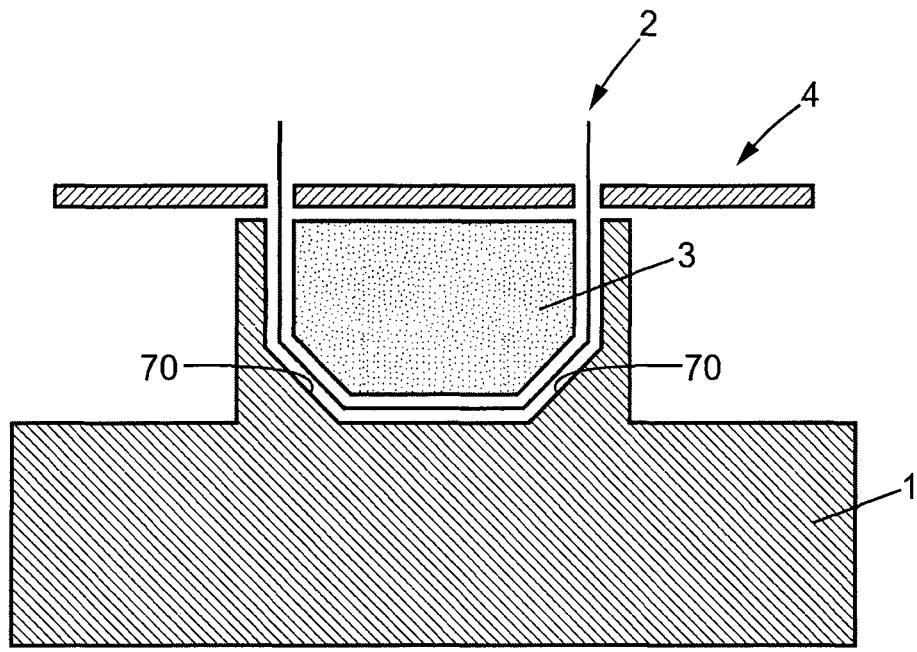
FIG. 9 is a schematically partial and sectional view of an assembly according to the invention.

In other embodiments, such that shown on FIG. 9, the section of the channel 12 can be different from a quadrilateral. For example, the support 1 comprises intermediate surfaces 70 between the bottom surface 13 and side surfaces 14, 15. In other words, the channel 12 can comprise more than two side surfaces. In such an embodiment, the first PCB 2 comprises corresponding portions. In such an embodiment, the folding angles can be less than 90°. The risk of deterioration of the electrical connections through the folding lines 26 is reduced.

The PCB 2, 4 can be manufactured in the inactive and planar state, at least partly by known and/or automated techniques. The support layers 21, 41 are preferably rigid. The word rigid means that the support layer can be broken rather than to be bent. For example, the support layers 21, 41 can be made of glass-reinforced epoxy. The rigidity of the support layer 21, 41 enhances the good mechanical strength of the tridimensional structure. As explained above, the support layer 21 of the first PCB 2 can be made of thin strips forming the folding lines 26. As long as the electrical continuity of the tracks 27 from one portion to another portion is preserved, two adjacent portions can be at least partially broken along their common folding line 26 during an assembling process of the assembly 100. Here, the thickness of the support layers 21, 41 are superior or equal to 0.8 millimeters.

The electrical conductive layers 22, 42, 44 and the layout of the tracks 27, 47 can be made by known methods, for example by selective electrochemical copper etching or selective electrochemical copper deposition. Preferably, the thickness of the tracks 27, 47 are superior or equal to 105 micrometers.

In some embodiments, the tracks 27, 47 of the PCB 2, 4 can also comprise a wire or a plurality of wires embedded in the support layer 21, 41. For example, WO 2006/077163, WO 2006/077164 and WO 2006/077167 describe methods to form tracks in or on a PCB that are planned to support power level of electricity.

Figure 7:
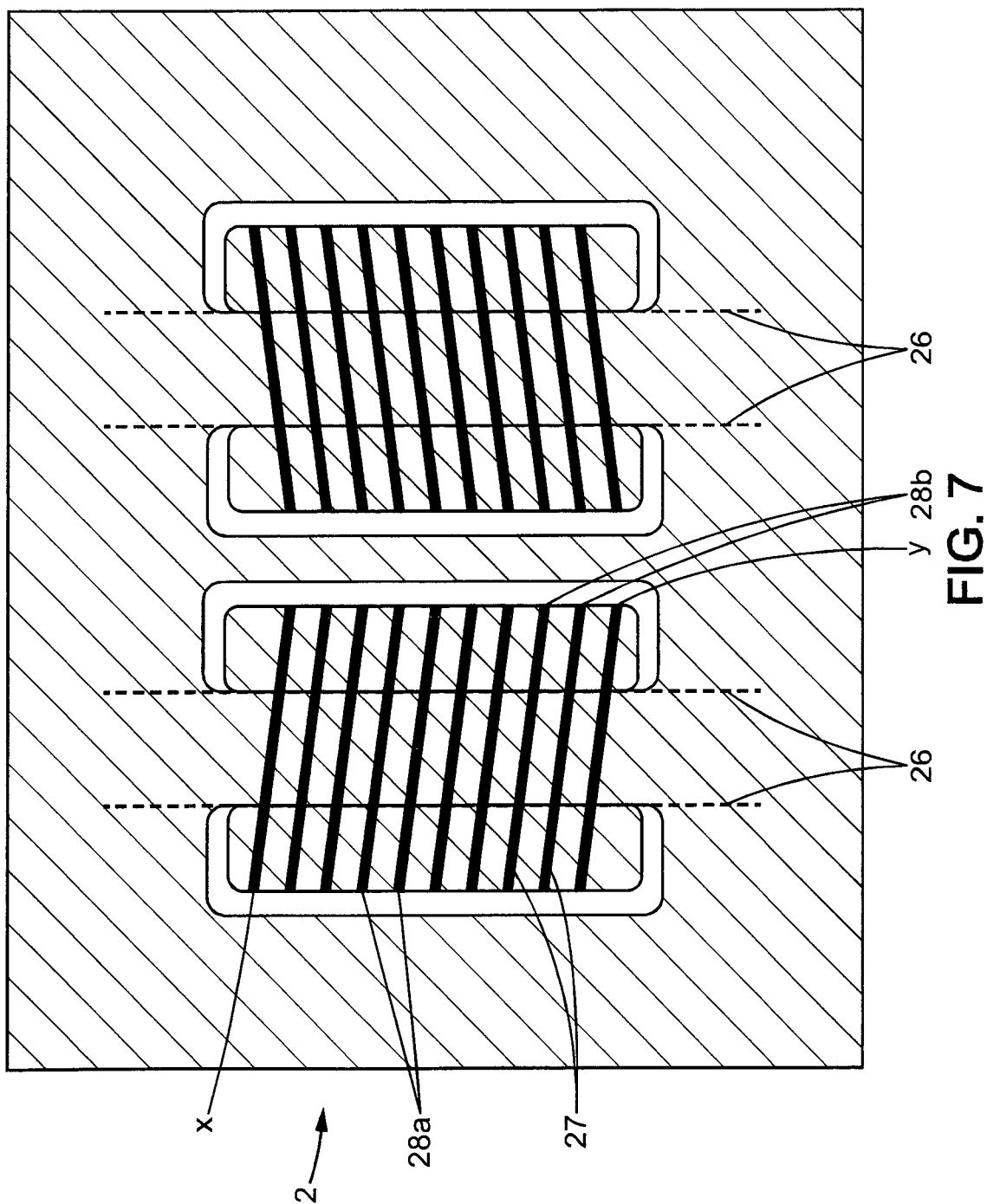
FIG. 7 is a top view of a PCB of an assembly according to the invention.
Figure 8:
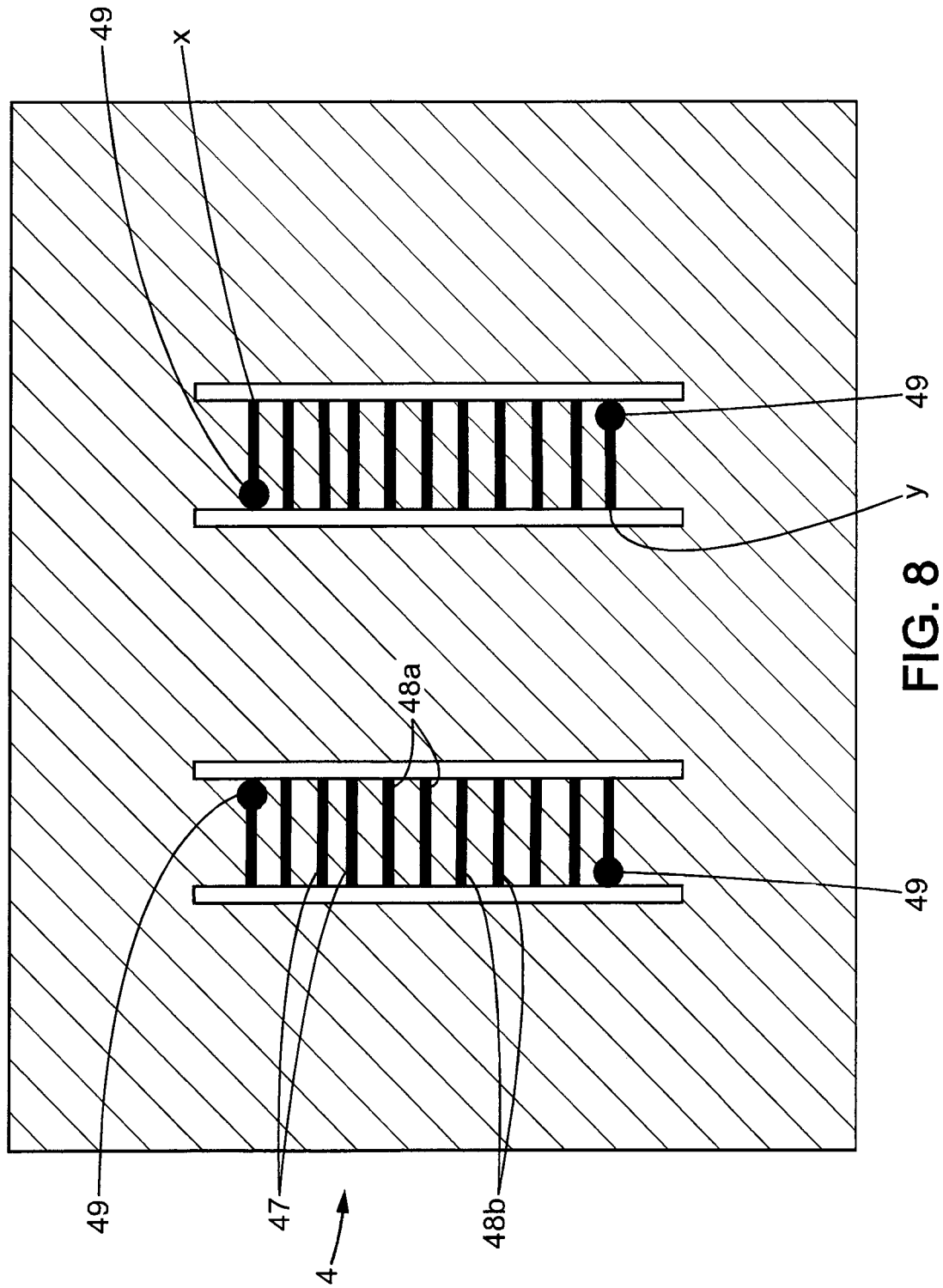
FIG. 8 is a bottom view of a PCB of an assembly according to the invention.

FIG. 7 shows an embodiment of the first PCB 2 view from the top in an inactive and planar state. FIG. 8 shows an embodiment of the second PCB 4 view from below in a planar state. The first PCB 2 and the second PCB 4 are compatible.

On FIG. 7, there is no cutting corresponding to the curved portions of a channel 12. As a consequence, the embodiments of FIG. 7 can be compatible with the embodiment of FIGS. 1 to 4 only if the channel 12 is discontinuous, deprived from curved portions of the internal wall 17 and the external wall 18.

In an assembled state, the four flaps of the first PCB 2 of FIG. 7 are folded along the folding lines 26. The second PCB 4 of FIG. 8 is reverted such that the point X of FIG. 8 is disposed on the point X of FIG. 7, and such that the point Y of FIG. 8 is disposed on the point Y of FIG. 7. Then, the tracks 27 are electrically connected to the tracks 47. According to the layout of the tracks 27, 47 shown on FIGS. 7 and 8, the assembling of the first PCB 2 and the second PCB 4 results in two symmetrical coils, each coils being made of a single track, each single track being composed successively and alternatively of tracks 27 and 47.

Figure 10:
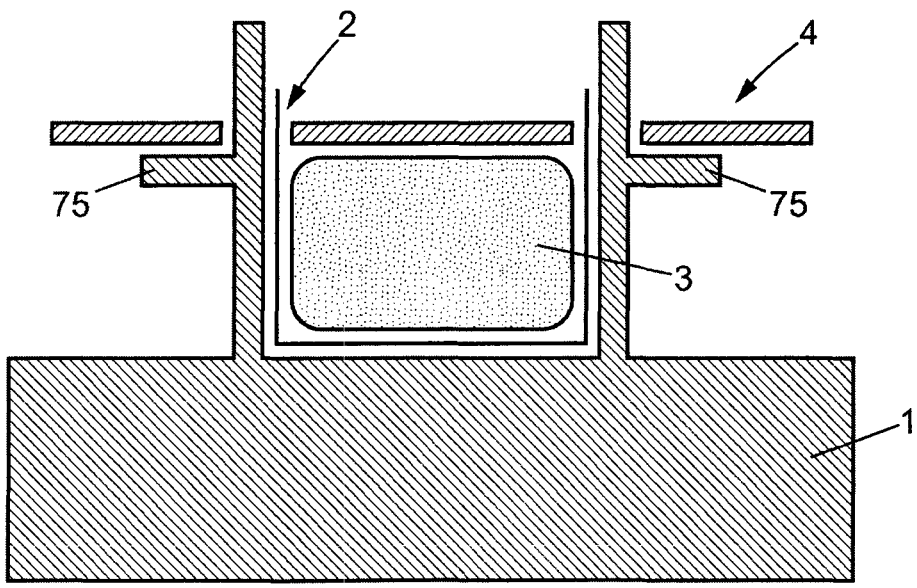
FIG. 10 is a schematically partial and sectional view of an assembly according to the invention.

In the embodiment of FIG. 10, the internal and external walls 17, 18 protrude from the second PCB 4 in the operational state (upward on FIG. 10). The external walls 17, 18 comprise wings 75 protruding toward the opposite of the channel 12 (toward left and right on FIG. 10). The wings 75 can be used as support parts to dispose the second PCB 4. In the embodiment shown on FIG. 10, the external walls 17, 18 and the wings 75 are made in one piece with the support 1. The protruding parts of the external walls 17, 18 and the wings 75 enhance the heat evacuation. This is only an example of the support 1. In various embodiments, other arrangements of the support 1 can be intended to enhance the heat evacuation, for example cooling fins.

In the embodiments described above, the straight portions of the magnetic piece 3 are surrounded by an assembly of the first PCB 2 and the second PCB 4. In the embodiment as shown on FIGS. 11 to 14, the inductive assembly 100 comprises a single PCB 2 and do not comprises the second PCB 4. By comparison, the second PCB 4 is replaced by a fourth main portion (cover portion 40) of the PCB 2.

Here, the cover portion 40 is connected to the external side portion 25 by a further folding line 26. The internal side portion 24 is wider than the external side portion 25 such that an end part of the internal side portion 24 protrudes from the cover portion 40 in the operational state. By comparison to the above described embodiments, the tracks 27 of the first (and single) PCB 2 are continuous around the magnetic piece 3. During the mounting operations, the connecting spots 28a are each connected to a corresponding connecting spot 28b.

In the example of FIGS. 11 to 14, the cover portion 40 includes a support layer and an electrical conductive layer similar to that of the other main portions 23, 24, 25 and including end parts of the tracks 27 of the first PCB 2. In other words, and as shown on FIG. 13, each track 27 extends electrically continuously from the main portion 24 to the cover portion 40 and passing by the bottom portion 23, the external side portion 25 and the folding lines 26. The tracks 27 extends essentially on the top main face of the first PCB 2, corresponding to the face oriented toward the magnetic piece 3 in the operational state. Each track 27 also comprises, in the cover portion 40, an end portion on the bottom main face of the first PCB 2 (see FIG. 14). The cover portion 40 comprises electrical connections between the two electrical conductive layers to ensure electrical continuity of each track 27, for example vertical interconnect access 49 (VIA).

In the embodiment shown on FIGS. 11 to 14, in absence of a second PCB 4 and tracks 48, the connecting spots 28a and 28b of the tracks 27 are arranged to be directly connected one to the others. Each connecting spot 28a of a first track 27 is arranged to be electrically and directly connected to a connecting spot 28b of a second track 27 to form a winding around the magnetic piece 3 and to inductively couple the first PCB 2 and the magnetic piece 3. As a result, the set of tracks 27 connected together forms a single continuous track, said single track forming windings, or loops, surrounding the straight portion 31 of the magnetic piece 3. The two ends of said single continuous track corresponds to two connecting spots 28a, 28b of two distinct tracks 27 and are referenced 50 on FIGS. 13 and 14. In an operational state, the two connecting spots 50 are used to electrically connect the assembly 100 to other components.

Figure 11:
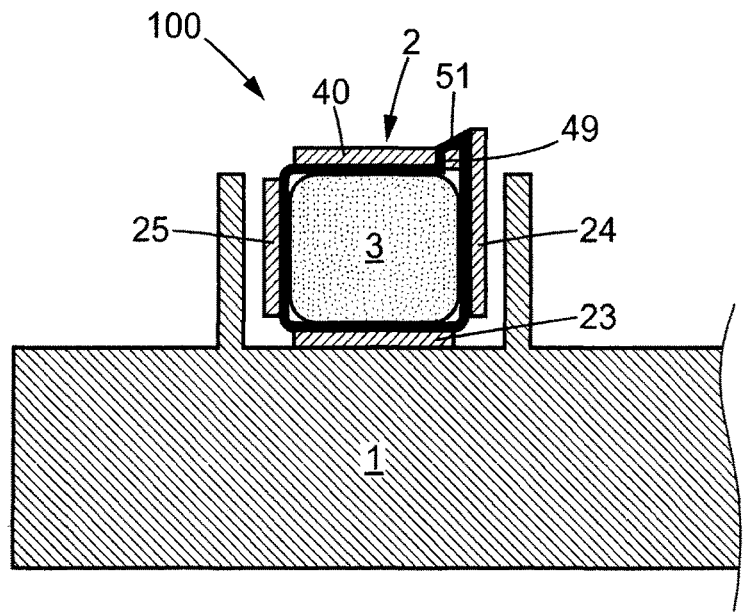
FIG. 11 is a schematically partial and sectional view of an assembly according to the invention.
Figure 12:
FIG. 12 is a sectional view of a piece of the assembly of FIG. 11 before assembling.
Figure 14:
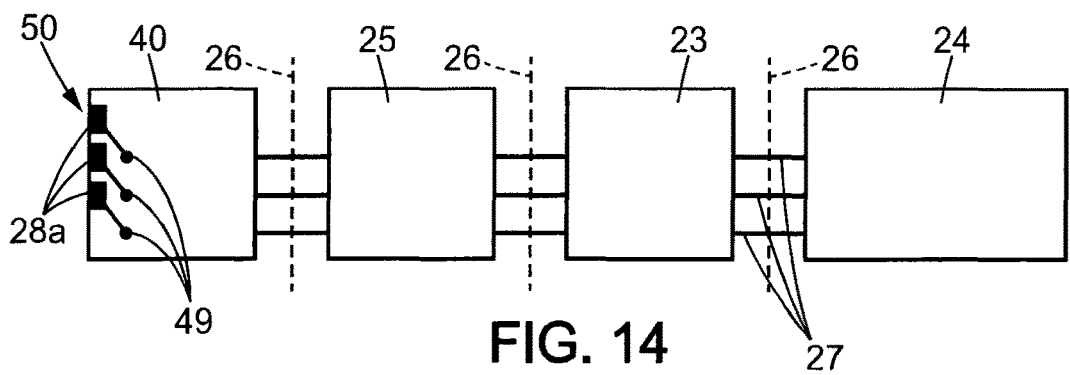
FIG. 14 is a bottom view of the piece of FIG. 12.

In the embodiment of FIGS. 11, 14, the tracks 27 are substantially parallel to each other. The portion of each track 27 on the top face of the first PCB 2 is oriented in the width direction. The little portion on the bottom face is angled with respect to the width direction. This facilitates the electrical connection between the connecting spots 28a, 28b of two adjacent tracks 27 in the operational state. In various embodiments, the layout of the tracks 27 can be different while enabling to form windings, or loops, surrounding the straight portion 31 of the magnetic piece 3. For example, the tracks 27 can be slightly angled with respect to the width direction, for example ±20°.

Figure 13:
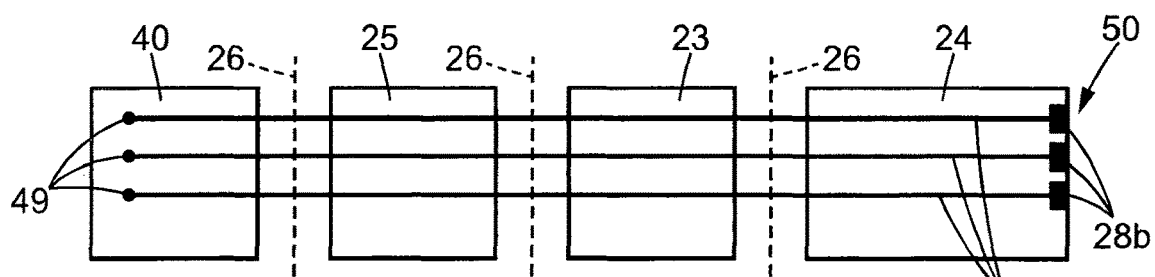
FIG. 13 is a top view of the piece of FIG. 12.

In order to facilitate understanding, only three tracks 27 are shown on the example of FIGS. 13 and 14. The number of the tracks 27, and consequently the number of the loops around the magnetic piece 3, can be different from three and adapted in function of needs.

In the operational state of the embodiment of FIGS. 11 to 14, each connected pair of connecting spots 28a, 28b, includes a welding spot 51. In such embodiments, the adding of the welding spots can easily be made by known techniques after the cover portion 40 being placed over the magnetic piece 3 (see FIG. 11).

In a various embodiment, the connecting spots 28a, 28b comprise solder pads able to be soldered two by two. In the configuration shown on FIGS. 11 to 14, the connecting spots 28a extend substantially perpendicular to the connecting spots 28b.

The layout of the tracks 27 is selected in order to form windings around the straight portion 31 of the magnetic piece 3 when the assembly 100 is in an operational state. The single and continuous track formed of the set of tracks 27 extends in a constant rotational direction around the magnetic piece 3. When the assembly 100 is in an operational state and when a current circulates in the single and continuous track, the induced magnetic fields of loops are superimposed without being cancelling themselves, such that the windings of each straight portion is electrically and magnetically efficient.

The cover portion, like the second PCB 4, is able to electronically receive components once being disposed over the magnetic piece 3. For example, the bottom electrical layer can comprise other tracks planned to receive other electronic components.

The first PCB 2 of the embodiment shown on FIG. 7 and the first PCB 2 of the embodiment of FIGS. 11 to 14 can be combined, for example to obtain a single foldable PCB without need for the second PCB 4 of FIG. 8. For example a dual flap could replace one of the two single flaps of each pair shown on FIG. 7.

The features of the embodiments of inductive assemblies described here can be combined with each other. Especially, most of the features described related to the second PCB 4 can be transposed to the cover portion 40 of the first PCB 2. An advantage of such an inductive assembly is the high adaptability: the forms and sizes of the inductive assembly can be arranged in function of the available volume, the needs and the final use. A man skilled in the art would easily understand that other embodiments of inductive assemblies according to the invention can have forms and sizes very different from thus shown on figures while providing similar electromagnetic functions.

When the assembly 100 is combined with other electronical components, the applicant noted that the heat dissipation is particularly efficient for the inductive device itself and also for the neighboring electrical components such as capacitors and semi-conductors.

The assembly 100 can be used for example to form a transformer or an inductor. The support 1, the first PCB 2, the second PCB 4 if necessary, and the magnetic piece 3 can be provided separately or into a kit. Such a kit can comprise only one of the elements, a combination thereof and/or other articles to be assembled, for example electronic components. Before to be used, the said elements, especially the first PCB 2, can be kept in a planar state, for example during manufacturing, storage and/or transport.

In the embodiments described relative to FIGS. 1 to 8, the PCB disposed in the bottom of the channel 12 is foldable while the PCB disposed over the channel 12 is not. In various embodiments, this can be reversed: the PCB disposed in the bottom of the channel 12 is non-foldable, for example made in a single planar piece, while the PCB disposed over the channel 12 is foldable such that side parts are inserted vertically inside the channel and surrounding the magnetic piece 3. In other embodiments, the assembly 100 and/or the kit to form the assembly 100 comprise at least one foldable PCB and optionally one or a plurality of non-foldable PCB arranged to be assembled to the foldable PCB and to form windings inductively coupled to a magnetic piece.

The known inductive devices, especially thus designed to at least kilowatt levels (current of several amperes) have a large magnetic section, a large volume, a large mass and are also difficult to cool down. The known inductive devices are generally made by assembling a plurality of discrete pieces. Due to the limited number of models for each discrete piece and their availability at each time, each industrial actor usually has to make a compromise between the best technical features (theoretic) in function of each application, and the cost of the unitary pieces (economic reality). The adaptability of the inductive devices is very limited. According to the inductive device 1 with a foldable PCB, the specific features of each inductive device can be easily and precisely selected in function of each application. It will be understood that the precise features are almost unlimited (especially number, shape and size of the foldable PCB 2, section and layout of the tracks 27, 47, form and size of the magnetic piece, configuration of the various cooling options).

In addition, the manufacturing of such an assembly 100 can be highly or totally automated. This enables to reduce the manufacturing cost.

An assembly 100 can be manufactured as follows:
provide the support 1 including a main face 11 wherein the open channel 12 is formed. The channel 12 have at least one straight portion, the bottom surface 13 of the channel 12 connecting two side surfaces 14, 15 of the channel 12 to each other,
dispose on the support 1 the PCB 2 having a plate shape and comprising a plurality of a tracks 27, each track 27 being electrically continuous between a pair of connecting spots 28a, 28b,
press the support 1 and the PCB 2 toward each other such that the PCB 2 is folded and covers the bottom surface 13 and the side surfaces 14, 15 of at least the straight portion of the channel 12 of the support 1,
provide the magnetic piece 3 having a shape and a size corresponding to the shape and the size of the channel 12 into the channel 12 once the PCB 2 equipping the channel 12.

The remainder of the manufacturing process depends from the embodiments of the assembly 100.

For the embodiments comprising at least a second PCB, for example embodiments of FIGS. 1 to 8:
assemble to the printed circuit board (the first PCB 2) and above the magnetic piece 3 the second PCB 4 having a plate shape and comprising the plurality of tracks 47, each track 47 being electrically continuous between a pair of connecting spots 48a, 48b, and
connect electrically the two connecting spots 48a, 48b of each pair of the second PCB 4 respectively to a connecting spot 27a of a first track 27 of the first PCB 2 and to a connecting spot 27b of a second track 27 of the first PCB 2 to form a winding around the magnetic piece 3 and to inductively couple the two PCB 2, 4 and the magnetic piece 3.

For the embodiments comprising a single PCB to form the inductive windings, for example embodiments of FIGS. 11 to 14:
fold up the cover portion 40 of the PCB 2 (the first and single PCB) above the magnetic piece 3, and
connect electrically at least one connecting spot 28a of a first track 27 to a connecting spot 28b of a second track 27 to form a winding around the magnetic piece 3 and to inductively couple the PCB 2 and the magnetic piece 3.

The process can also comprise to form the folding lines 26 as explained above. A thermal conductive material, for example a paste, can be added in order to enhance the heat dissipation between the pieces of the assembly 100.

The invention is not limited to the pieces, assemblies, kits and process described here, which are only examples. The invention encompasses every alternative that a person skilled in the art would envisage in the scope of the following claims.

The invention claimed is:

1. Inductive assembly comprising:
a support including a main face wherein an open channel is formed, the channel having at least one straight portion with a bottom surface of the channel connecting at least two side surfaces of the channel to each other,
a printed circuit board, the printed circuit board being foldable from a plate shape to a folded state such that to cover at least a part of the bottom surface and at least a part of the side surfaces of the straight portion of the channel, the printed circuit board comprising a plurality of tracks, each track being electrically continuous between a pair of connecting spots,
a magnetic piece having a shape and a size corresponding to the shape and the size of the channel such that the magnetic piece can be accommodated into the channel when the printed circuit board equips the channel,
the printed circuit board being arranged to surround at least partially a portion of the magnetic piece in the folded state in the channel such that at least one connecting spot of a first track is electrically connected to a connecting spot of a second track to form a winding around the magnetic piece and to inductively couple the printed circuit board and the magnetic piece.

2. Inductive assembly according to claim 1, wherein the printed circuit board comprises main portions arranged to surround said portion of the magnetic piece in the folded state.

3. Inductive assembly according to claim 1, wherein
the printed circuit board is a first printed circuit board and comprises main portions arranged to only partially surround said portion of the magnetic piece in the folded state,
the connecting spots of each pair being distant one from the other in a state where the printed circuit board equips the channel, the inductive assembly further comprising:
a second printed circuit board having a plate form and comprising a plurality of a tracks, each track being electrically continuous between a pair of connecting spots, the shape and the size of the second printed circuit board and the locations of the connecting spots being mutually arranged such that the second printed circuit board can be assembled to the first printed circuit board to surround together the magnetic piece when the magnetic piece is disposed into the channel), and such that the two connecting spots of each pair of the second printed circuit board is electrically connected respectively to a connecting spot of a first track of the first printed circuit board and to a connecting spot of a second track of the first printed circuit board, thereby the electrical connection of the spots of the first printed circuit board being ensured through the tracks of the second printed circuit board to form windings around the magnetic piece and to inductively couple the printed circuit boards and the magnetic piece.

4. Inductive assembly according to claim 1,
wherein the connecting spots comprise solder pads able to be soldered two by two.

5. Inductive assembly according to claim 1,
wherein the channel covered by the printed circuit board includes at least a straight portion having a length superior to 1 centimeter.

6. Inductive assembly according to claim 1,
wherein the tracks comprise a wire embedded inside the printed circuit board.

7. Inductive assembly according to claim 1,
wherein connection between at least some of the connecting spots and corresponding tracks of the printed circuit board is performed with a Vertical Interconnect Access such that the printed circuit board is able to electronically receive components once being disposed over the magnetic piece.

8. Inductive assembly according to claim 1, further comprising at least one power semiconductor element, positioned on the printed circuit board or embedded into the printed circuit board, at least partially above one of the side surfaces.

9. Inductive assembly according to claim 1,
wherein the support comprises a core part, an internal wall and an external wall, the internal wall and the external wall protruding away from the core part, the open channel being delimited between the internal wall and the external wall.

10. Inductive assembly according to claim 9, further comprising at least one capacitor, fixed on a face of the printed circuit board oriented toward the support and in an external side of the external wall and/or internal side of the internal wall.

11. Kit of pieces to assemble comprising at least two pieces mutually compatibles to faun an assembly according to claim 3, among the following pieces:
the support,
the first printed circuit board,
the magnetic piece, and
the second printed circuit board.

12. Method of manufacturing an inductive assembly comprising:
a) provide a support including a main face wherein an open channel is formed, the channel having at least one straight portion with a bottom surface of the channel connecting two side surfaces of the channel to each other,
b) dispose on the support a printed circuit board having a plate shape and comprising a plurality of a tracks, each track being electrically continuous between a pair of connecting spots,
c) press the support and the printed circuit board toward each other such that the printed circuit board is folded and such that the printed circuit board covers the bottom surface and the side surfaces of at least the straight portion of the channel of the support,
d) provide a magnetic piece having a shape and a size corresponding to the shape and the size of the channel into the channel once the printed circuit board equipping the channel, and
implement the following steps e1 and f1, or the following steps e2 and f2:
e1) assemble to the printed circuit board and above the magnetic piece a second printed circuit board having a plate shape and comprising a plurality of tracks, each track being electrically continuous between a pair of connecting spots,
f1) connect electrically the two connecting spots of each pair of the second printed circuit board respectively to a connecting spot of a first track of the first printed circuit board and to a connecting spot of a second track of the first printed circuit board to form a winding around the magnetic piece (3) and to inductively couple the printed circuit boards and the magnetic piece,
e2) fold up a portion of the printed circuit board above the magnetic piece,
f2) connect electrically at least one connecting spot of a first track to a connecting spot of a second track to form a winding around the magnetic piece (3) and to inductively couple the printed circuit board and the magnetic piece.

\* \* \* \* \*